(12) United States Patent
Kwon et al.

(10) Patent No.: US 8,035,968 B2
(45) Date of Patent: Oct. 11, 2011

(54) DISPLAY APPARATUS

(75) Inventors: Oh Kwan Kwon, Gumi-si (KR); Jae Min Hyun, Gumi-si (KR); Kyung Won Lee, Gumi-si (KR); Soon Koo Park, Gumi-si (KR)

(73) Assignee: LG Electronics Inc., Seoul (KR)

( * ) Notice: Subject to any disclaimer, the term of this patent is extended or adjusted under 35 U.S.C. 154(b) by 85 days.

(21) Appl. No.: 12/526,362

(22) PCT Filed: Aug. 7, 2008

(86) PCT No.: PCT/KR2008/004603
§ 371 (c)(1),
(2), (4) Date: Aug. 7, 2009

(87) PCT Pub. No.: WO2009/028808
PCT Pub. Date: Mar. 5, 2009

(65) Prior Publication Data
US 2010/0321887 A1   Dec. 23, 2010

(30) Foreign Application Priority Data

Aug. 30, 2007   (KR) ......................... 10-2007-0087574

(51) Int. Cl.
*H05K 7/20* (2006.01)
(52) U.S. Cl. .............. 361/695; 361/679.21; 361/679.48; 361/679.49; 361/679.5; 361/694; 165/104.33; 165/122; 454/184
(58) Field of Classification Search .............. 361/679.21, 361/679.46–679.5, 688, 689, 690–697, 724–727; 165/104.33, 104.34, 122, 126, 802, 803; 165/185; 174/16.3, 252, 254, 260; 349/58, 349/60–65, 20, 161; 313/11, 13, 17, 22–25, 35, 36, 44, 46, 27, 582; 362/31, 373, 294; 403/375, 339, 354; 454/184; 312/223.1, 223.2, 236
See application file for complete search history.

(56) References Cited

U.S. PATENT DOCUMENTS

| 5,748,269 | A | * | 5/1998 | Harris et al. ..................... 349/58 |
| 5,869,919 | A | * | 2/1999 | Sato et al. ........................ 313/17 |
| 5,991,153 | A | * | 11/1999 | Heady et al. ..................... 361/704 |
| 6,043,979 | A | * | 3/2000 | Shim .............................. 361/695 |
| 6,104,451 | A | * | 8/2000 | Matsuoka et al. ............... 349/58 |
| 6,476,882 | B1 | * | 11/2002 | Sakurai ........................... 349/55 |
| 6,493,440 | B2 | * | 12/2002 | Gromatzky et al. .......... 379/161 |
| 6,825,828 | B2 | * | 11/2004 | Burke et al. ................... 345/101 |
| 6,833,674 | B2 | * | 12/2004 | Kaneko et al. ................ 313/587 |

(Continued)

FOREIGN PATENT DOCUMENTS
FR   2891940 A1 *  4/2007
(Continued)

*Primary Examiner* — Michael V Datskovskiy
(74) *Attorney, Agent, or Firm* — Birch, Stewart, Kolasch & Birch, LLP

(57) ABSTRACT

A display unit is disclosed. A display apparatus includes a panel unit displaying images, a circuit unit provided a rear surface of the panel unit, a chamber surrounding the circuit unit, the chamber forming a predetermined space and at least one ventilation fan ventilating air inside the chamber along a circulation path passing beyond the circuit unit. According to a display apparatus according to the present invention, parts which are mounted in the display apparatus may be protected from external moisture or dust. Furthermore, heat radiation may be performed efficiently in the display apparatus according to the present invention even if environments of heat exchanging with an outside may not be formed enough in a structure of the display apparatus.

21 Claims, 8 Drawing Sheets

U.S. PATENT DOCUMENTS

| | | | |
|---|---|---|---|
| 7,064,954 B1 * | 6/2006 | Wu et al. | 361/695 |
| 7,161,803 B1 * | 1/2007 | Heady | 361/700 |
| 7,164,586 B2 * | 1/2007 | Lin | 361/714 |
| 7,173,678 B2 * | 2/2007 | Havelka et al. | 349/58 |
| 7,190,578 B2 * | 3/2007 | Bang et al. | 361/694 |
| 7,269,023 B2 * | 9/2007 | Nagano | 361/752 |
| 7,286,347 B2 * | 10/2007 | Wang et al. | 361/695 |
| 7,447,018 B2 * | 11/2008 | Lee et al. | 361/695 |
| 7,463,487 B2 * | 12/2008 | Kim | 361/715 |
| 7,522,416 B2 * | 4/2009 | Kim et al. | 361/695 |
| 7,570,489 B1 * | 8/2009 | Sun et al. | 361/695 |
| 7,667,964 B2 * | 2/2010 | Kang et al. | 361/692 |
| 7,755,893 B2 * | 7/2010 | Yanagawa et al. | 361/695 |
| 7,800,706 B2 * | 9/2010 | Kim et al. | 349/58 |
| 7,813,124 B2 * | 10/2010 | Karppanen | 361/679.56 |
| 2002/0067591 A1 * | 6/2002 | Tajima | 361/681 |
| 2004/0196628 A1 * | 10/2004 | Hisano et al. | 361/689 |
| 2006/0232010 A1 * | 10/2006 | Ginyard | 273/292 |
| 2007/0029070 A1 | 2/2007 | Yamamoto et al. | |
| 2007/0076431 A1 * | 4/2007 | Atarashi et al. | 362/613 |

FOREIGN PATENT DOCUMENTS

| | | |
|---|---|---|
| JP | 2007-052951 A | 3/2007 |
| JP | 2007-101783 A | 4/2007 |
| KR | 10-2006-0060976 A | 6/2006 |
| KR | 10-2006-0103633 A | 10/2006 |
| KR | 2006110651 A * | 10/2006 |

* cited by examiner

[Fig. 1]
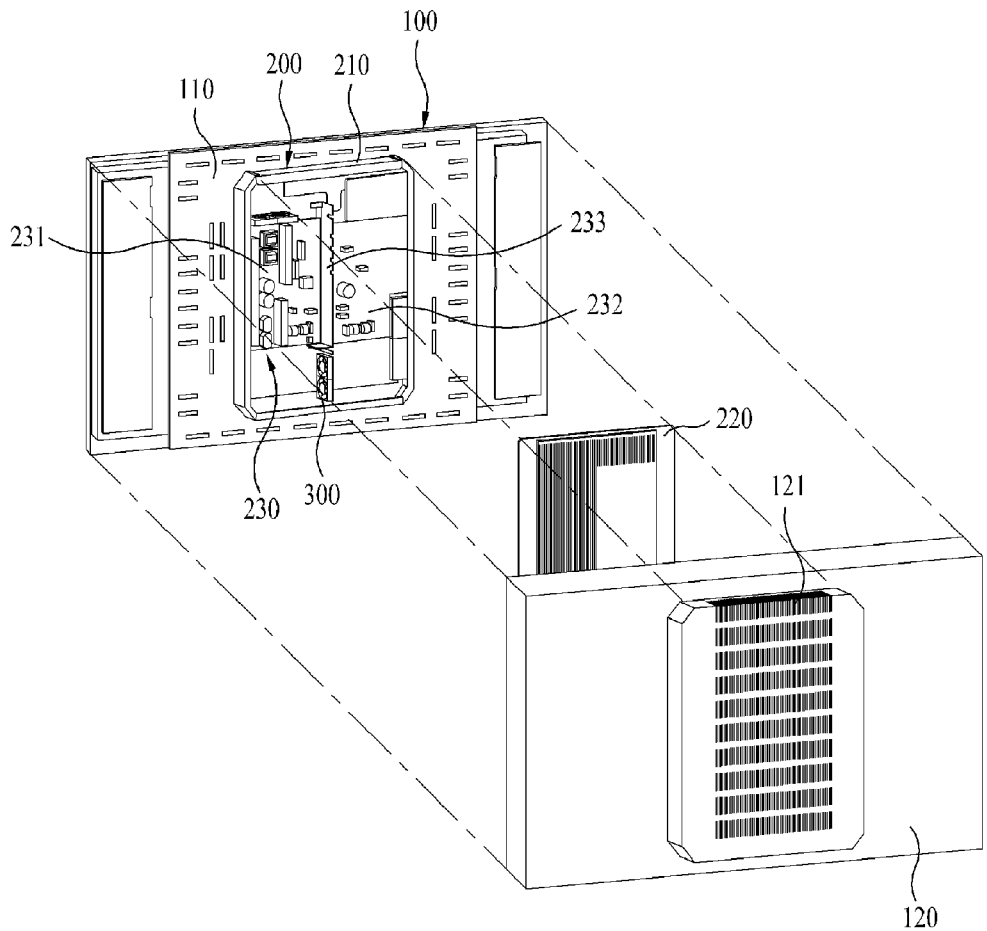
[Fig. 2]
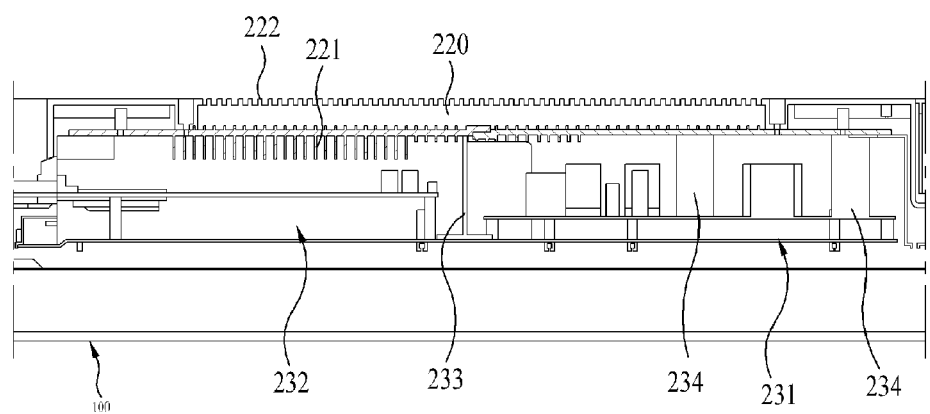

[Fig. 3]
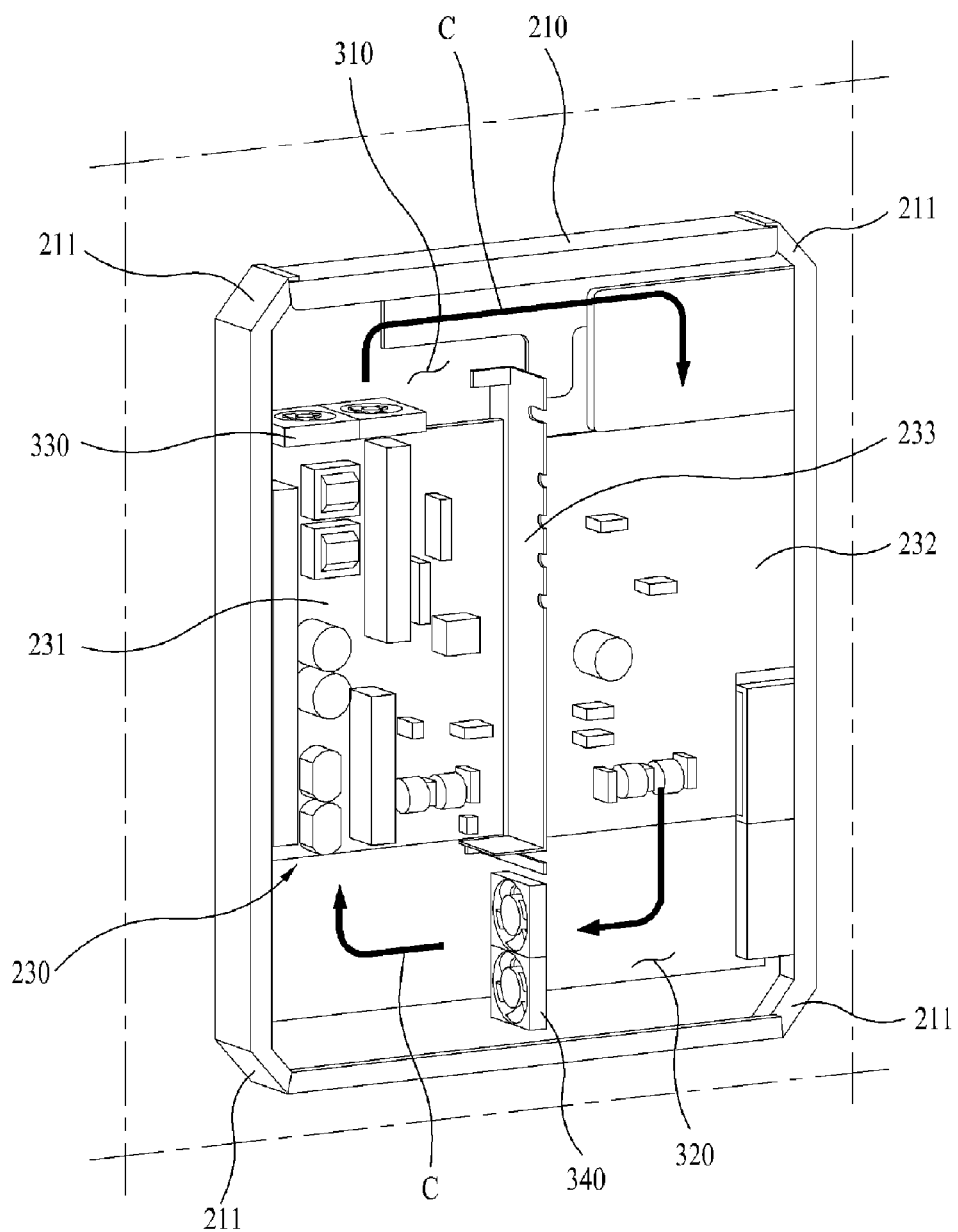

[Fig. 4]
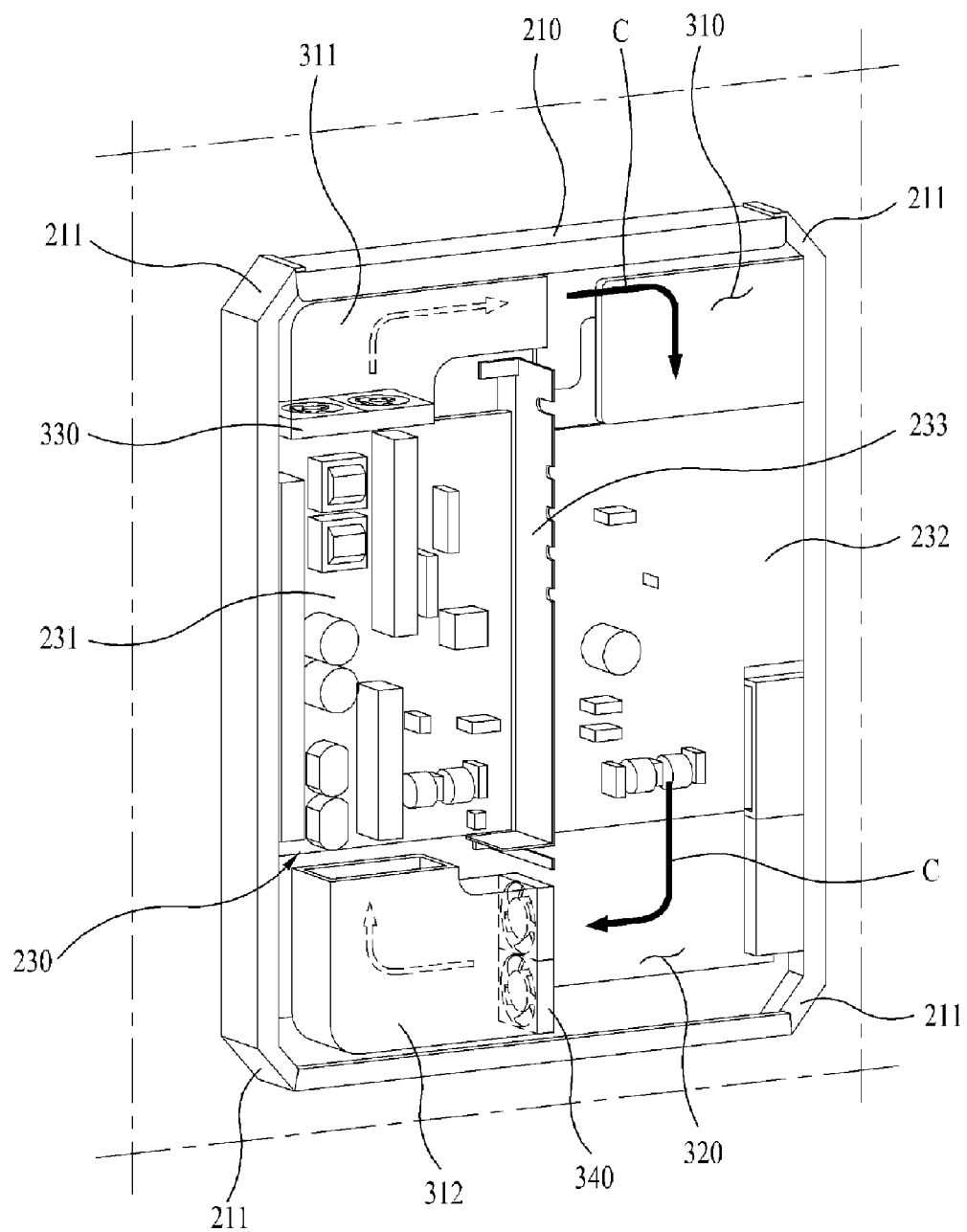

[Fig. 5]
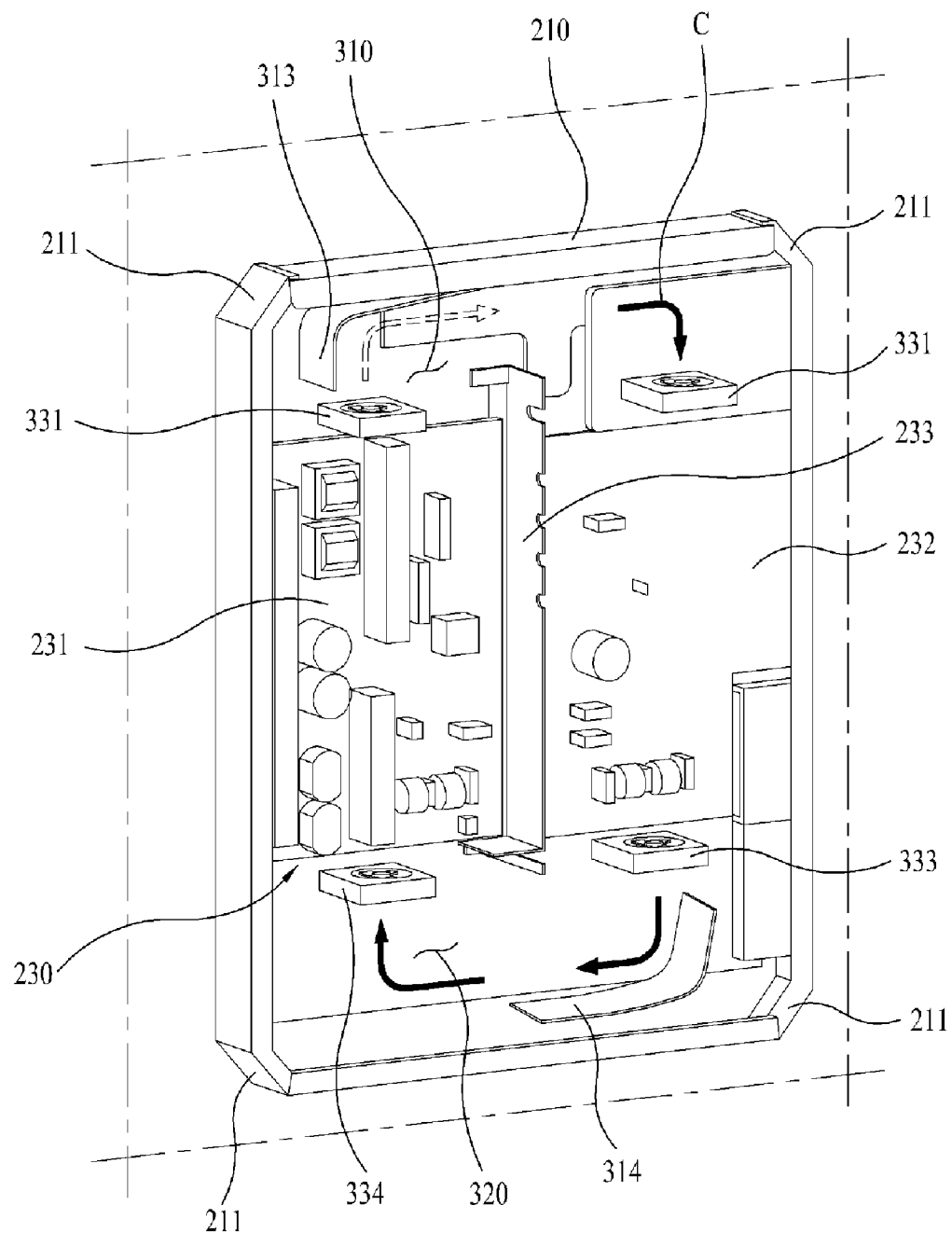

[Fig. 6]
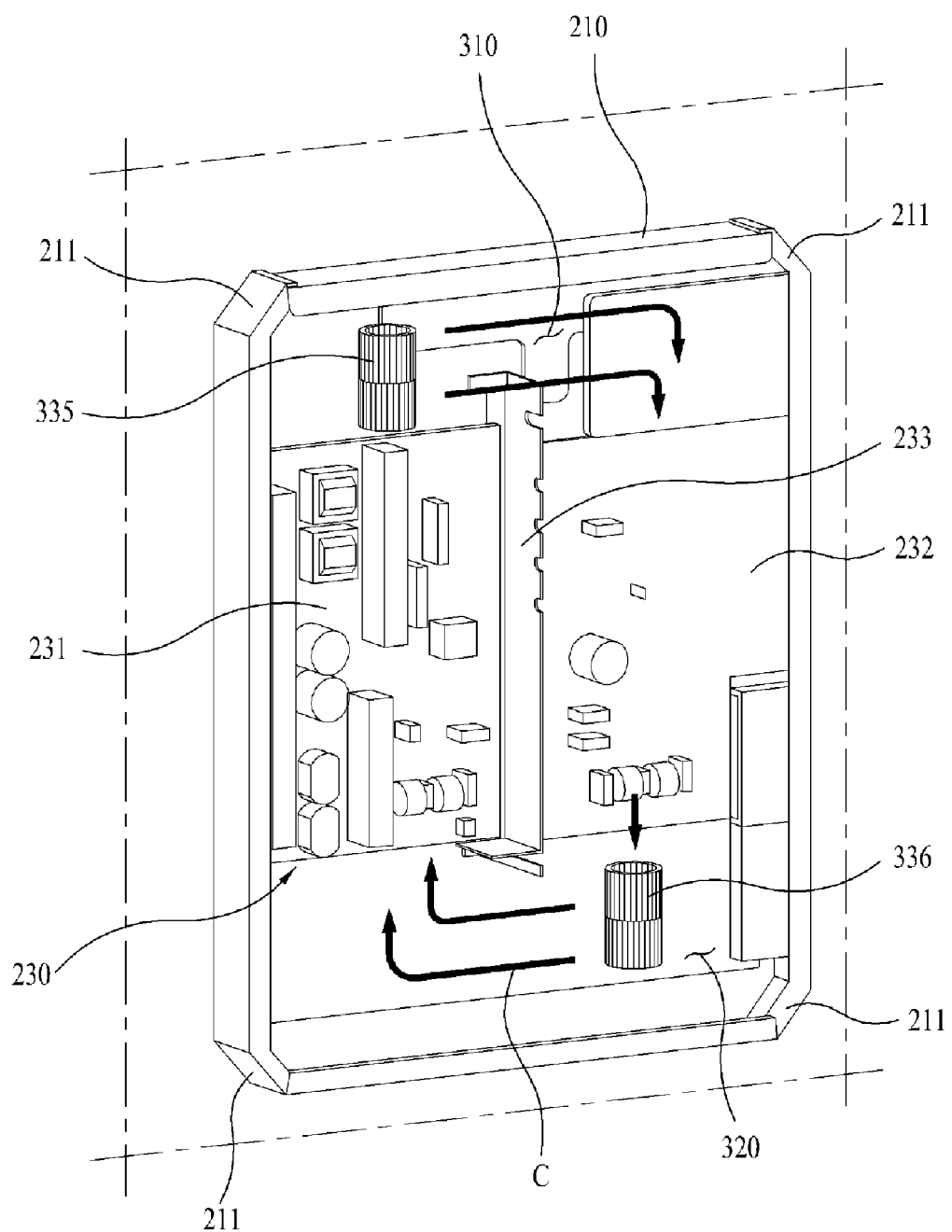

[Fig. 8]
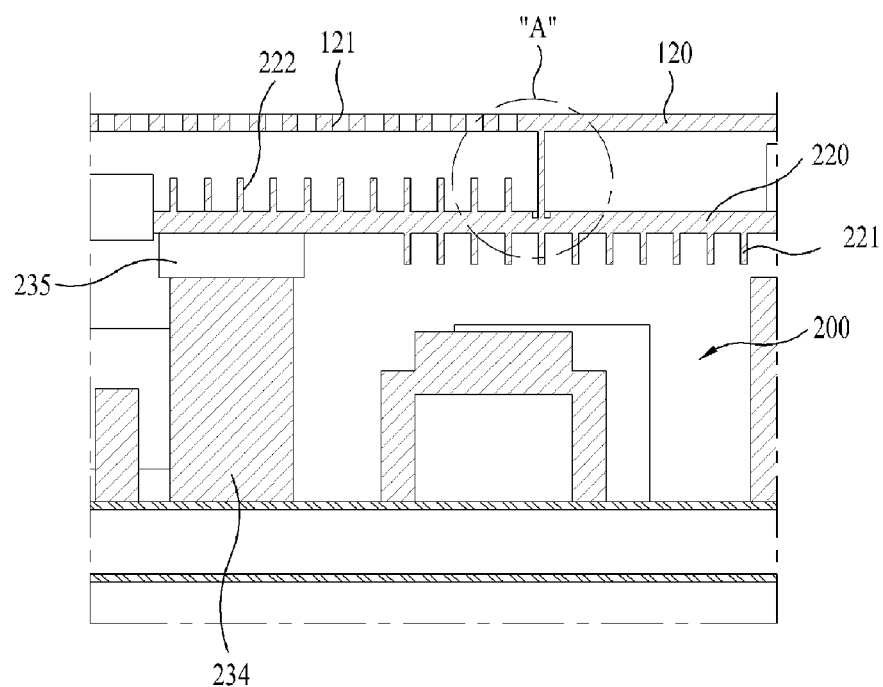
[Fig. 9]
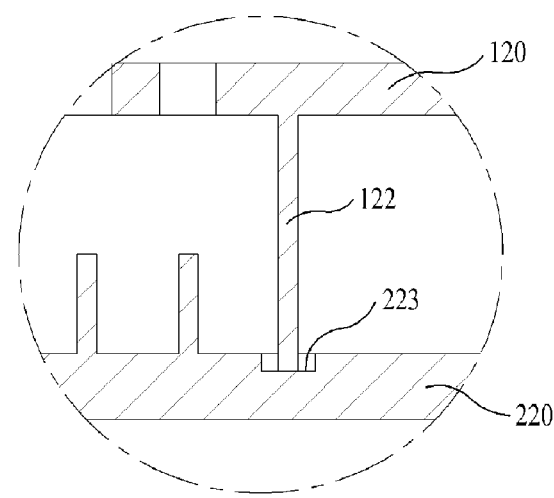

[Fig. 10]
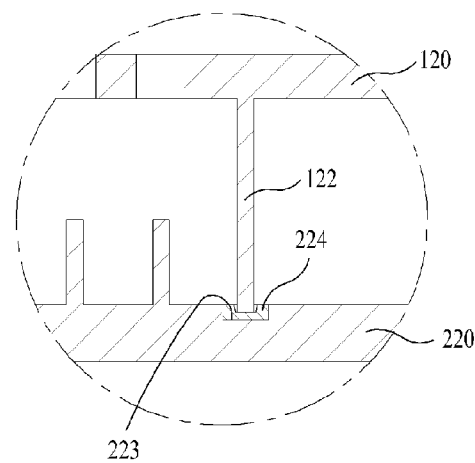
[Fig. 11]
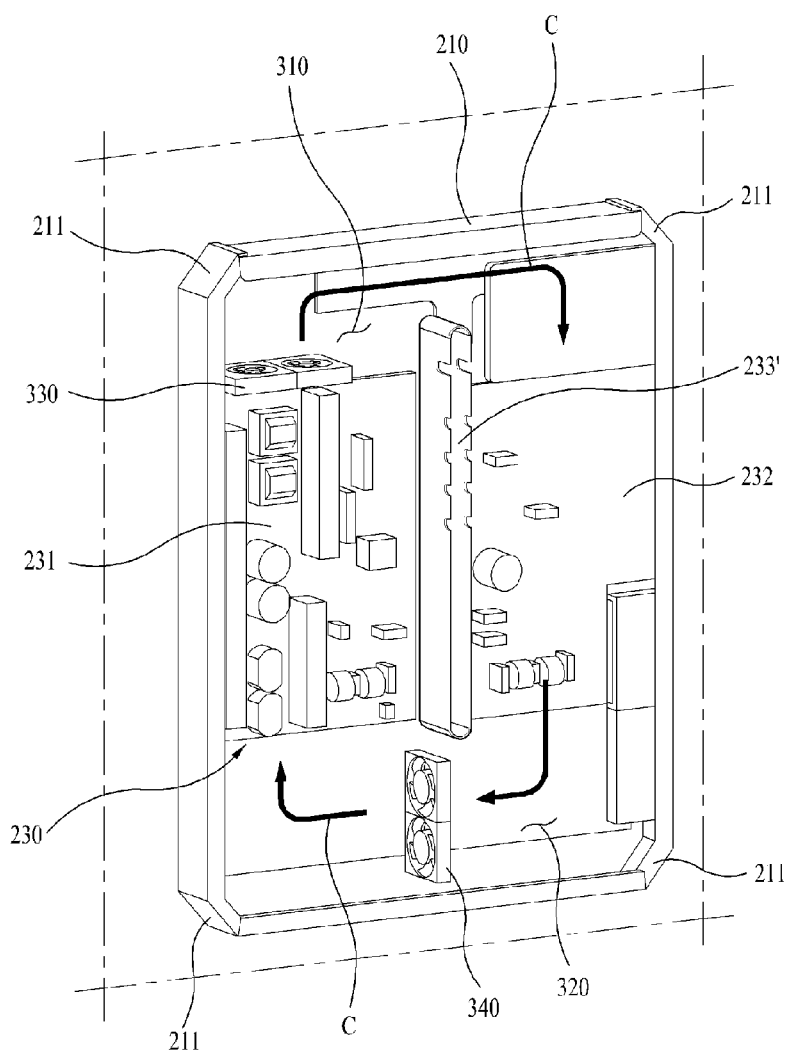

DISPLAY APPARATUS

TECHNICAL FIELD

The present invention relates to a display apparatus. More specifically, the present invention relates to a display apparatus which has an efficient heat radiation structure if environments of exchanging heat with an outside and of protecting parts mounted in a display apparatus from external moisture or dust may not be created.

BACKGROUND ART

A display apparatus typically for displaying images of a TV or monitor may include a power supply device, a circuit device for processing predetermined information and other parts. Here, the display apparatus may be embodied in a liquid crystal display (LCD), plasma display panel (PDP), organic light emitting diode (OLED), field emission display (FED), 3D display and variations of them.

Such the parts may corrode or malfunction if they are exposed to moisture or dust. A conventional display apparatus may have an inside in communication with an outside to radiate heat generated by the inner parts efficiently.

That is, a vent is formed at a housing of the conventional display apparatus and a ventilation fan is provided in the display apparatus, such that inner hot air is discharged outside and the inner heat is radiated.

DISCLOSURE OF INVENTION

Technical Problem

However, such the method might make the inner parts mounted in the conventional display exposed to moisture and dust and this will result in display apparatus performance deterioration or short usage life.

In addition, if the inside of the display apparatus fails to be in communication with the outside or such environments of non-communication between the inside and the outside fail to be created, there might be problems of heat radiation failure in the conventional display apparatus.

Technical Solution

To solve the problems, an object of the present invention is to provide an efficient heat radiation structure of a display apparatus if an inside of a display apparatus is not in communication with or closed from an outside for protection against dust and moisture.

To achieve these objects and other advantages and in accordance with the purpose of the invention, as embodied and broadly described herein, a display apparatus includes a panel unit displaying images; a circuit unit provided a rear surface of the panel unit; a chamber surrounding the circuit unit, the chamber forming a predetermined space; and at least one ventilation fan ventilating air inside the chamber along a circulation path passing beyond the circuit unit.

The circulation path may pass beyond different parts mounted on the circuit unit.

The circulation path may be formed in the chamber in plural.

The circulation path may passes beyond a high density area where parts are intensively mounted on the circuit unit with a high density and a relatively low density area where parts are mounted on the circuit unit with a relatively low density.

The display apparatus may further include a partition member partitioning off the high density area and the low density area.

The partition member may partition the space of the chamber into a right and left space, an upper and lower end of the partition member being spaced apart from the chamber only to form a gap, and the circulation path may pass through the gap.

The circulation path may be a closed path which reciprocates the right and the left space partitioned by the partition member.

The at least one of the plural ventilation fans may be provided near an upper end of the high density area to ventilate the air passing the high density area to the low density area along the circulation path.

The display apparatus may further include at least one ventilation fan provided at a predetermined position except in the high density area.

The chamber may include a radiation plate radiating heat inside the chamber and a frame supporting the radiation plate, and the partition member may be in contact with an inner surface of the radiation plate and an upper surface of the circuit unit.

If the circulation path is formed in the chamber in plural, each of the circulation paths may pass through a ventilation opening formed at the partition member.

A ventilation fan may be mounted at the ventilation opening.

A guide may be formed at a corner of the frame.

At least one guide member or guide duct may be provided in at least one corner of the chamber to guide the air circulating the circulation path, respectively.

The ventilation fan may be provided at an end of the guide duct.

A plurality of radiation pins may be provided on an inner surface of the radiation plate, facing the circuit unit.

The plurality of the radiation pins may be arranged in parallel with the circulation path.

The length of the radiation pin provided beyond the high density area may be substantially shorter than the length of the radiation pin provided beyond the low density area.

The display apparatus may further include a heat transfer member connecting the radiation plate beyond the high density area with a circuit substrate of the high density area.

The partition member may be a track-shaped ring formed of a sheet.

In another aspect, a display apparatus may include a panel unit displaying images; a circuit unit connected with an external power to process the images displayed at the panel unit; a circuit housing surrounding the circuit unit to form a predetermined space, the circuit housing formed of metal to radiate heat generated from the circuit unit to an outside; and at least one ventilation fan circulating air inside the circuit housing to reduce variations of surface temperatures of the circuit housing heated by the heat generated at the circuit unit.

The display apparatus may further include at least one temperature sensor measuring a temperature inside the circuit housing. Here, a rotation speed of the ventilation fan may be adjustable.

The display apparatus may further include a partition member partitioning an inner space of the circuit unit into predetermined two spaces.

The ventilation fan may circulate the air inside the circuit housing to the partitioned spaces.

In a still further aspect, a display apparatus includes a panel unit displaying images; a circuit unit comprising a circuit substrate where a plurality of circuit parts are mounted; a circuit housing surrounding the circuit unit, the circuit housing being sealed; and an air ventilation fan transferring the heat generated from the circuit unit to predetermined other portions of the circuit housing.

Advantageous Effects

The present invention has following advantageous effects.

According to a display apparatus according to the present invention, parts which are mounted in the display apparatus may be protected from external moisture or dust.

Furthermore, heat radiation may be performed efficiently in the display apparatus according to the present invention even if environments of heat exchanging with an outside may not be formed enough in a structure of the display apparatus.

BRIEF DESCRIPTION OF THE DRAWINGS

The accompanying drawings, which are included to provide further understanding of the disclosure and are incorporated in and constitute a part of this application, illustrate embodiments of the disclosure and together with the description serve to explain the principle of the disclosure.

In the drawings:

FIG. 1 is an exploded perspective view illustrating a display apparatus according to an exemplary embodiment;

FIG. 2 is a sectional view illustrating a chamber shown in FIG. 1;

FIGS. 3 to 7 are diagrams schematically illustrating key parts of the display apparatus to describe specific embodiments, respectively;

FIG. 8 is a sectional view illustrating a rear portion of the display apparatus according to the exemplary embodiment;

FIGS. 9 and 10 are diagrams of enlarged 'A' shown in FIG. 8, to describe specific embodiments, respectively; and FIG. 11 depicts another embodiment of the invention.

BEST MODE FOR CARRYING OUT THE INVENTION

Figure 7:
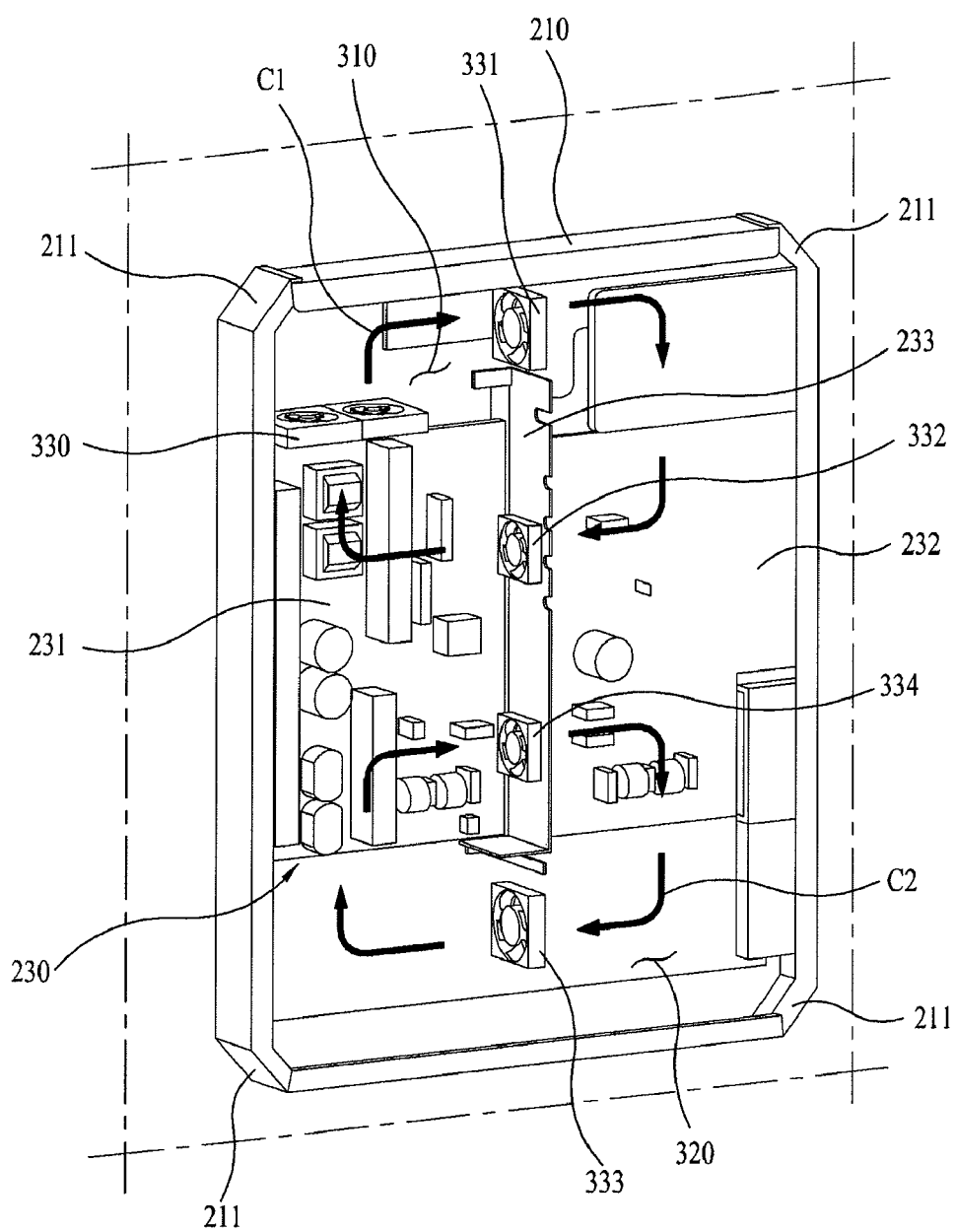

Reference will now be made in detail to the specific embodiments of the present invention, examples of which are illustrated in the accompanying drawings. Wherever possible, the same reference numbers will be used throughout the drawings to refer to the same or like parts.

FIG. 1 is an exploded perspective view of a display apparatus according to an exemplary embodiment. In reference to FIG. 1, the display apparatus according to the embodiment will be described schematically.

As shown in FIG. 1, the display apparatus includes a body 100 having a panel unit, a circuit unit 230 provided at a rear surface of the body 100, a chamber 200 surrounding the circuit unit 230 and a rear cover 120 covering the rear surface of the body 100.

The body 100 having the panel unit includes a display unit (not shown) to display predetermined information. A circuit substrate and electric parts are disposed at a rear surface of the body 100.

Specifically, the chamber 200 and a rear portion 110 are provided at the rear surface of the body 100. Here, the rear portion 110 is a predetermined portion of the rear surface except the chamber 200.

The chamber 200 defines an inner space with a predetermined size and electric devices such as a power supply device and various circuit substrates are intensively disposed in the chamber 200. Here, the electric devices such as the power supply device and the various circuit substrates are referenced to as a circuit unit 230 hereinafter.

The chamber 200 includes a frame 210 surrounding a predetermined space at the rear surface of the body 100 and a radiation plate 220 radiating heat from the circuit unit 230. The frame 210 and the radiation plate 220 may form the chamber surrounding the circuit unit 230.

The radiation plate 220 is coupled to the frame 210 by an auxiliary securing structure or a securing structure provided at the frame 210 and the radiation plate 220.

As a result, the chamber 200 may be closed from the outside by the frame 210 and the radiation plate 220.

If the radiation plate 220 is coupled to the frame 210 as mentioned above, the chamber 200 is closed enough to prevent external dust or moisture from coming therein, not closed airtight.

For the protection against dust or moisture, the chamber 200 surrounding the circuit unit 230 may be closed from the outside to a predetermined degree. Also, if there is a limit of non-communication with external air in a display unit, such the heat radiation may be adapted.

The circuit unit 230 provided in the chamber 200 may be disposed on the rear surface of the body 100, having various electric devices and circuit parts mounted on a PCB. Since a pattern of disposing the parts may not be uniform, the circuit unit 230 may be divided into a high density area 231 where parts are mounted intensively and a low density area 232 where parts are mounted relatively less intensively.

Here, the density of the parts may be relative. In the present embodiment, the high density area 231 is referenced to as a portion where the density of parts is relatively high in the chamber 200 or where the power supply device and relating parts which generate relatively much heat are intensively mounted. In contrast, the low density area 232 may be referenced to as a portion where the parts are mounted relatively less intensively. If there is little difference of density enough not to distinguish the high density area and the low density area, the high density area may be a portion where there is relatively much heat as the power is applied. Namely, the density may mean a heat generation possibility because of the density of the parts.

The reason why the circuit unit is divided into the high density area 231 and the low density area 232 may be that the density of the chamber 200 is not uniform as mentioned above. Especially, it may be advantageous to arrange the relating parts adjacent one another in consideration of the smooth performance among the parts when the parts are put into operation, such that the overall wiring may be shortened.

As mentioned above, the high density area and the low density area, which may be divided by the density of the parts, generate different amounts of heat. As a result, the heat generated in the high density area is more than the heat generated in the low density area within the chamber 200.

Here, the high density area 231 may be a high temperature area and the low density area 232 may be a low temperature area if the display apparatus is put into operation.

At this time, the high or low density is a relative concept in the single chamber 200 according to the density of the parts. That is, the density of the parts may be different if the identical parts are not mounted at a regular distance. As a result, the portion with a relatively high density of the parts may be the high density area and the portion with a relatively low density of the parts may be the low density area.

As shown in FIG. 1, according to the display apparatus of the exemplary embodiment, the high density area 231 and the low density area 232 may be divided in the right and left direction.

The display apparatus according to this embodiment may further include a partition member 233 partitioning the chamber 200 into the high density area 231 and the low density area 232. The partition member 233 is spaced apart a predetermined distance from an upper end and lower end of the frame 210 substantially in a vertical direction, not extended from the upper and to the lower end of the frame 210.

The partition member 233 shown in FIG. 1 is provided in a longitudinal plate-shape and it is not limited thereto. The partition member 233 may be formed in any shape only if it is capable of guiding the patterned air flux within the chamber 200 (see a circulation path which will be described later).

The partition member 233 guides the inner air of the chamber 200 to be circulated with a predetermined pattern if a ventilation fan 300 is put into operation within the chamber 200.

Furthermore, a ventilation fan 300 is provided between the high density area 231 and the low density area in the chamber 200 to circulate the air. The ventilation fan 300 will be described in detail later.

FIG. 2 is a sectional view of the chamber shown in FIG. 1 and in reference to FIG. 2 an inner configuration of the chamber 200 will be described in detail.

As shown in FIG. 2, the inner space of the chamber 200 is partitioned into the high density area 231 and the low density area 232 by the partition member 233 and the radiation plate 220 may be provided beyond the inner space of the chamber 200.

The radiation plate 220 absorbs the heat generated from the high and low density area 231 and 232 and it exchanges heat with external air to discharges the heat outside.

It is preferable that the radiation plate 220 includes at least one radiation pin 211 and 222 to enlarge the heat exchange section. Inner radiation pins 221 may be formed at an inner surface of the chamber 200 and outer radiation pins 222 may be formed at an outer surface of the chamber 200.

Either of the inner radiation pin 221 or the outer radiation pin 222 may be provided and both the inner radiation pin 221 and the outer radiation pin 222 may be provided to enlarge the heat exchange section.

The length of the inner radiation pins 221 formed at an inner surface of the radiation plate 220 covering the high density area 231 may be substantially short in comparison with the length of the inner radiation pins 221 formed at an inner surface of the radiation plate 220 covering the low density area 232. Since the density of the parts in the high density area 231 is higher than the density of the parts in the low density area 232, enough space for the radiation pins may not be provided and the heat generated in the high density area 231 may be radiated to the low density area 232.

In addition, it is preferable that the inner radiation pins 221 out of the radiation pins may be in parallel to a circulation path which will be described later. If the radiation pins are provided in parallel to the circulation path, the flux of the air may be less interfered with.

As mentioned above, the partition member 233 is a kind of a member guiding the patterned air flux within the chamber 200. If it were not for the partition member 233, the air flux of the chamber would form a turbulent flow without a predetermined pattern only to prevent efficient heat transfer and heat radiation.

Because of that, the partition member 233 is in contact with the radiation plate 220 to prevent the air from flowing across the partition member 233 only to be heat-exchanged.

If the air beyond the high density area 231 and the low density area 232 passes through the partition member 233 directly to cause the heat exchange, a turbulent flow is formed in the chamber 200 only to deteriorate the heat exchange efficiency. As a result, it is preferable that the high density area 231 heat-exchanges with the low density area 232 in a predetermined pattern, rather than to heat-exchange with the low density area irregularly.

At this time, it is not necessary for the partition member 233 to be in contact with the radiation plate 220. that is, the partition member 233 may be spaced apart a predetermined distance from the radiation plate 220 enough to shut the air of the high density area 231 and the low density area 232 from being heat-exchanging by irregular air flux.

In the high density area 231 is provided an auxiliary radiation member 234 and it is preferable that the high density area 231 may have double-heat radiation, due to the radiation performed by the radiation plate 220 and the radiation member 234.

The partition member 233 according to the embodiment of the display apparatus may partition off the high density area 231 and the low density area 232, such that a predetermined pattern of air circulation is created between the high density area 231 and the low density area 232.

However, to discharge the generated heat outside, it may not be enough only to transfer the heat of the high density area 231 to the low density area 232 by using the air circulation.

Accordingly, the radiation member 234 may be further provided which extends to the radiation plate 220 from a substrate of the high density area 231. The portion of the radiation plate 220, which covers the high density area 231, may be heated by the heat generated by the substrate of the high density area 231 and the parts installed on the substrate and some of the heat may be radiated via the radiation plate 220. That is, the heat is transmitted from the high density area 231 to the radiation plate 220 in a method of a heat transfer of using the frame 210 or convection current.

The heat generated from the high density area 231 may be larger than the heat generated from the low density area 232 and thus it is preferable that the heat of the high density area 231 is discharged to the low density area or outside quickly as possible.

That is, it may be inefficient in the matter of reliability of the parts that the heat generated from the high density area 231 remains near the high density area 231. Thus, it is preferable that the heat of the high density area 231 is discharged to the low density area 232 or outside as soon as possible.

The display apparatus according to the embodiment equalizes temperatures of the circuit unit including the parts with different heat amounts, respectively, and it radiates the heat via the radiation plate 220 uniformly. Here, the total amount of the heat generated from the high density area 231 and the low density area 232 is not different according to whether the radiation plate 220 is provided or not. Although the amount of the heat generated from the high density area 231 is different from that of the heat generated from the low density area 232, the present invention is provided to the variation of the heat generated from the radiation plate 220 covering the high density area 231 and the low density area 232.

Thus, if the heat of the high density area 231 fails to move to the low density area 232 quickly enough, the radiation member 234 accelerates the heat of the high density area 231 to be transmitted to the radiation plate 220.

The radiation plate 220 may be in contact with or spaced apart a predetermined distance from the radiation member 234. To maximize the heat radiation, the radiation plate 220 may be in contact with the radiation member 234.

If the radiation plate 220 is spaced apart a predetermined distance from the radiation member 234, an auxiliary heat transfer member 235 may be provided between the radiation plate 220 and the radiation member 234 to improve the heat radiation efficiency.

The heat transfer member 235 is employed to transmit the heat of the radiation member 234 to the radiation plate 220.

According to the embodiment shown in FIG. 2, the radiation member 234 is in contact with the radiation plate 220 by the medium of the heat transfer member 235.

Although not shown in the drawings, a membrane may be provided at the radiation plate to improve the pressure change inside the chamber. As a result, a dewdrop-laden surface of the radiation plate 220 may be prevented.

In reference to FIGS. 3 to 7, each embodiment of the display apparatus will be described in detail.

Here, FIGS. 3 to 7 are diagrams schematically illustrating key parts of each embodiment.

First of all, a display apparatus according to an embodiment shown in FIG. 3 will be described.

As shown in FIG. 3, the display apparatus according to the embodiment includes the frame 210. The circuit unit and at least one ventilation fan 330 and 340 may be provided in the frame 210.

The inner space of the frame 210 is partitioned into the high density area 231 and the low density area 232 by the partition member 233.

As described above, the partition member 233 has an upper and lower end open, not extended to the frame 210.

That is, in the embodiment shown in FIG. 3, the high density area 231 and the low density area 232 are in communication with each other via a gap between the frame 210 and the partition member 233.

The gap between the frame 210 and the partition member 233 may be a path of the air flowing between the high density area 231 and the low density area 232, when the ventilation fans 330 and 340 are put into operation.

An upper portion and a lower portion of the gap formed between the frame 210 and the partition member 233 may be defined as a first path 310 and a second path 320, respectively.

According to this embodiment shown in FIG. 3, the first path 310 is positioned beyond the high and low density area 231 and 232 in the frame 210. The second path 320 is positioned below the high and low density area 231 and 232 in the frame 210.

Generally, a flat type display apparatus has the panel unit installed in a proximately vertical direction. The heat generated from the circuit unit of the display apparatus expands ambient air and the heated and expanded air has property of flowing upward because of the density variation. As a result, the heat generated from the high density area 231, according to the embodiment of FIG. 3, heats ambient air and the heated air is convective upward to the first path 310.

The heated air that has flown to the first path 310 is transmitted beyond the low density area 232 via the gap between the frame 210 and the partition member 233 by a first ventilation fan 330 installed adjacent to the first path 310.

A circulation path (numeral reference C of FIG. 3) which will be described later may be a path passing the gap formed between the frame 210 and the partition member 233.

Unless the first ventilation fan 330 is turned off, the heated air beyond the high density area 231 may continuously move toward the low density area 232. Such the forcible convection enables the two portions having the different density of the circuit parts to exchange heat with each other.

The gap formed between the frame 210 and the partition member 233 may be formed between lower ends of the frame 210 and the partition member 233, as well as between the upper end of the frame 210 and the upper end of the partition member 233. According to the embodiment shown in FIG. 3, a second ventilation fan 340 is formed at the gap formed between the lower ends of the frame 210 and the partition member 233.

The second ventilation fan 340 forcibly moves the air of the lower portion of the low density area 232 to the lower portion of the high density area 231. due to the operating each of the ventilation fans, the air of the high density area 231 is transmitted to the low density area 232 and the air of the low density area 232 is transmitted to the high density area 232.

Thus, the air inside the chamber 200 forms the circulation path (C) and the heat of the high density area is transmitted to the low density area, such that the amount variation of the heat radiated via the radiation plate 220 may be minimized.

The air flowing along the circulation path (C) is circulated, passing the high density area 231 and the low density area 232, to cause the heat uniformity of the high density area 231 and the low density area 232. Here, it is preferable that the circulation path (C) is formed beyond each different part of the circuit unit. For example, if the air is circulated beyond the identical parts in different heights, the beyond object of this embodiment cannot be accomplished. As a result, it is preferable that the circulation path (C) passes beyond different parts installed on the circuit unit 200.

In addition, the circulation path (C) may be a closed path which reciprocates the spaces partitioned off by the partition member 233. One of the objects of the present invention is to provide an efficient heat radiation structure if a vent in communication with an outside or a structure closed from an outside cannot be provided. Accordingly, the circulation path (C) may be a closed path.

The first and second ventilation fan 330 and 340 may include at least one fan. The at least one fan may be an axial fan or a cross flow fan and it may be various other kinds of fans. FIG. 3 shows that the ventilation fan 330 and 340 may include an axial fan.

According to the embodiment shown in FIG. 3, the first ventilation fan 330 may be arranged to have an axial direction upward and the second ventilation fan 330 may be arranged to have an axial direction to the high density area from the low density area. However, this arrangement of the fan unit is one of examples and the fan unit may be arranged to form the circulation path (C) of the air shown in FIG. 3.

At this time, if a plurality of fans are provided in the chamber, it is preferable that the fans are arranged spaced apart a predetermined distance from each other on the circulation path (C).

That is, the first ventilation fan 330 may be arranged near the upper end of the partition member 233, with its axial flow direction toward the low density area from the high density area and the second ventilation fan 340 may be arranged near the lower end of the partition member 233, with its axial flow direction toward the high density area from the low density area.

Alternatively, the first ventilation fan 330 may be arranged near an upper end of the high density area, with its axial direction upward and the second ventilation fan 340 may be arranged near a lower end of the low density area 232, with its axial direction downward.

Of course, the first ventilation fan 330 may be arranged near the upper end of the low density area 232, with its axial direction downward and the second ventilation fan 340 may be arranged near the lower end of the high density area 231, with its axial direction upward.

Such the variations of the fan unit is allowable if the plurality of the fans are spaced apart a predetermined distance from each other on the circulation path (C) to maintain the air flux between the high density area and the low density area on the circulation path (C) smoothly.

The circulation path (C) is a path of heat exchange between the high density area 231 and the low density area 232. Since the medium helping the heat exchange via the circulation path (C) is the air inside the chamber 200, the air inside the chamber 200 should be circulated along the circulation path (C) smoothly. At this time, the reason why the air should flow along the circulation path (C) smoothly is to make uniform the temperature distribution of the chamber.

On the other hand, the frame 210 employed as a column of the chamber 200 may have corners which are bent or curved to a predetermined angle and a guide 211 may be provided at the corner to make the air flow along the first path 310 and the second path 320 with no loss because of flow resistance.

Such the guide 211 may minimize the friction caused by the obstacle of the air flowing along the circulation path (C) formed in the chamber 200.

Because of the air circulated along the circulation path (C), the heat generated from the high density area 231 may move to the low density area 232 and the air of the low density area 232 at a relatively temperature is drawn in the high density area 231 such that the temperature of the chamber 200 may be equalized to a relatively uniform temperature and that the radiation plate 220 may radiate heat uniformly.

Next, a display apparatus according to another embodiment shown in FIG. 4 will be described.

The display according to this embodiment shown in FIG. 4 has a structure which is basically identical to the structure of the display apparatus according to the embodiment shown in FIG. 3, except a first guide duct 311 and a second guide duct 312 provided on the first path 310 and the second 320, respectively.

Specifically, the first guide duct 311 is provided on the first path 310 to guide the high temperature air ventilated from the high density area 231 by the first ventilation fan 330 to the low density area 232 and the second guide duct 312 is provided on the second path 320 to guide the relatively low temperature air ventilated from the low temperature portion 232 by the second ventilation fan 340 to the high density area 231.

An outlet of the second guide duct 312 may face an inlet of the first guide 311. These guide ducts may heighten the density or speed of the air passing the high density area 231 and thus enhance the cooling function of the air flowing beyond the high density area 231.

As shown in FIG. 4, the guide ducts 311 and 312 may be secured to the ventilation fans 330 and 340, respectively, or they may be provided on the paths 310 and 320, respectively, separated from the ventilation fans 330 and 340.

Also, the guide ducts 311 and 312 may be provided in an elbow type to guide the air passing the bent portions of the paths to flow smoothly.

The other structural elements of the display apparatus may be substantially identical to those of the display apparatus according to the embodiment shown in FIG. 3 and their detailed description will be omitted accordingly.

Next, in reference to FIG. 5, a display apparatus according to a still further embodiment will be described.

A structure of the display apparatus according to the embodiment shown in FIG. 5 is basically identical to the structure of the display apparatus according to the embodiment shown in FIG. 3, except that fans composing a first fan unit and a second fan unit are spaced apart a predetermined distance from each other on the paths and that a guide plate is provided on each of the path to guide the air flux.

As shown in FIG. 5, a first fan unit includes a first axial fan 331 provided on the upper end of the high density area 231, with an axial direction upward, and a second axial fan 332 provided on the upper end of the low density area 232, with an axial direction downward.

The second fan unit includes a first axial fan 333 provided under the lower end of the low density area 232, with an axial direction downward, and a fourth axial fan 334 provided under the high density area 231, with an axial direction upward.

A first guide plate 313 is provided on the first path 310 to guide the air flux and a second guide plate 314 is provided on the second path 320 to guide the air flux.

It is preferable that the guide plates 313 and 314 are bent to a predetermined angle to guide the air flowing along the bent path efficiently.

The guide plate 313 and 314 may be provided at a corner of the path 310 and 320 or at both corners of the path 310 and 320.

The other structural elements of the display apparatus according to this embodiment are substantially identical to those of the display apparatus according to the embodiment shown in FIG. 3 and their detailed description will be omitted accordingly.

In reference to FIG. 6, a display apparatus according to a still further embodiment will be described.

The structure of the display apparatus according to the embodiment shown in FIG. 6 is basically identical to the display apparatus according to the embodiment shown in FIG. 3, except a cross flow fan as the ventilation fan, not the axial fan.

Specifically, a first cross flow fan 335 is provided near the upper end of the high density area 231 to make the air drawn from the high density area 231 flow to the low density area 232 via the first path 310, with a rotational shaft installed vertically.

In addition, a second cross flow fan 336 is provided near the lower end of the low density area 232 to make the air drawn from the low density area 232 flow to the high density area 231 via the second path 320, with a rotational shaft installed vertically.

The cross flow fans 335 and 336 suck the air in a shaft direction and ventilate the air in a radial direction. As a result, it is preferable that the rotational shaft is approximately vertical for the first cross flow fan 335 to suck the high temperature air from the high density area 231 and for the second cross flow fan 336 to suck the relatively low temperature air from the low density area 232 smoothly.

Although the guide duct or guide plate is not shown in the embodiment shown in FIG. 6, it is possible in this embodiment to provide the guide duct or guide plate at the paths, respectively, such that the air flux may be performed more efficiently.

The other structural elements of the display apparatus according to this embodiment are substantially identical to those of the display apparatus according to the embodiment shown in FIG. 3 and their detailed description will be omitted accordingly.

Next, in reference to FIG. 7, a display apparatus according to a still further embodiment will be described.

According to the display apparatus of the embodiment shown in FIG. 7, two circulation paths C1 and C2 are formed in the chamber 200. That is, a first circulation path C1 is formed in an upper portion of the chamber 200 and a second circulation path C2 is formed in a lower portion of the chamber 200.

The first circulation path C1 is formed by a first fan unit 331 and 332 and the second circulation path C2 is formed by a second fan unit 333 and 334.

Specifically, the first air circulation C1 is performed by a first axial fan 331 provided above the partition member 233 and a second axial fan 332 provided at an upper portion of the partition member 233 and the air flow may be performed via the first path 310.

An axial direction of the first axial fan 331 is toward the low density area 232 from the high density area 231. The second axial fan 332 is provided at the partition member 233 and an axial direction of the second axial fan 332 is toward the high density area 231 from the low density area 232.

The second air circulation C2 is performed by a third axial fan 333 provided under the partition member 233 and the fourth axial fan 334 provided at a lower portion of the partition member 233 and the air flux is performed via the second path 320.

An axial direction of the third axial fan 333 is toward the high density area 231 from the low density area 232. The fourth axial fan 334 is provided at the partition member 233 and an axial direction of the fourth axial fan 334 is toward the low density area 232 from the high density area 231.

Because of the two circulation paths, the high density area 231 heat-exchanges with the low density area 232 and the temperature inside the chamber 200 is equalized to an average temperature of the high density area 231 and the low density area 232, such that the heat of the high density area 231 is performed distributively.

A guide member may be further provided at each of the paths to enhance the efficiency of the air circulation.

The other structural elements of the display apparatus according to this embodiment are substantially identical to those of the display apparatuses according to the above embodiments and their detailed description will be omitted accordingly.

Although not shown in FIGS. 3 to 7, a temperature sensor (not shown) may be installed in the high density area 231 and the sensor is connected with a control part (not shown). If a temperature sensed by the temperature sensor is over a preset temperature, the control part controls the ventilation fan to operate such that the heat inside the chamber is radiated automatically.

In reference to FIGS. 8 to 10, a configuration of a rear surface of the display apparatus according to the first embodiment will be described.

Here, FIG. 8 is a sectional view illustrating a rear surface of the display apparatus according to the first embodiment and FIGS. 9 and 10 are diagrams illustrating an enlarged 'A' shown in FIG. 8 to describe different embodiments, respectively.

As shown in FIG. 8, the rear cover 120 is provided in the rear of the radiation plate 220 covering the frame in the display apparatus and at least one ventilation hole 121 is formed at a portion of the rear cover 120 which corresponds to the radiation plate 220.

Because of the ventilation hole 121, the radiation plate 220 heat-exchanges with external air.

According to the display apparatus, a sealing member is provided between the radiation plate 220 and the rear cover 120 to prevent external dust or moisture from coming in the body (100, see FIG. 1) and the rear portion (110, see FIG. 1).

The sealing member will be described in reference to FIGS. 9 and 10.

As shown in FIG. 9, the sealing member includes a rib 122 provided at the rear cover 120 and a groove 223 provided at the radiation plate 220. An end of the rib 122 may be inserted in the groove 223.

Although not shown in the drawings, it is possible to form the rib 122 at the radiation plate 220 and form the groove 223 at the rear cover 120.

According to an embodiment shown in FIG. 10, a packing member 224 is provided in the groove 223 and an end of the rib 122 is in close contact with the packing member 223 to enhance the work of the sealing.

Due to the above configuration, the rear portion (110, see FIG. 1) of the body (100, see FIG. 1) is sealed and protected from external dust or moisture.

FIG. 11 illustrates a display apparatus according to a still further embodiment. This embodiment shown in FIG. 11 presents another example of the partition member which partitions off the high density area 231 and the low density area 232 in the chamber 200. The partition member 233' shown in FIG. 11 is provided in a long track appearance, which is different from the partition member of the embodiment shown in FIG. 7. If the partition member 233' is provided in a ring shape, there may be an effect of reducing the flow resistance the air passing the gap formed between the frame 210 and the partition member. Since the partition member 233' is gently curved in the gap, the turbulent current formed by the air flow resistance may be reduced and the air flows along the circulation path (C) smoothly.

Although the partition member 233' is a long track-shaped in a vertical direction, the partition member 233' may be a long track-shaped in a right-and-left direction by the change of the position of the ventilation fan.

The embodiment shown in FIG. 11 presents that the partition member 233' may be provided in a closed structure or ring shape, not a plate shape. The partition member partitions off the high density area 231 and the low density area 232 and it may be provided to help the air flowing along the circulation path (C) which connects the high density area 231 and the low density area 232. A scope of the partition member may include a structure capable of reducing the flow resistance of the air transmitted along the circulation path.

As mentioned above, the present invention provides a structure capable of radiating the heat generated from the circuit unit, making possible the protection against dust or moisture. Such the structure may be applicable to electric apparatuses which have inefficient air flow with an outside, rather than the display apparatus which has a closed structure for the protection against dust or moisture.

That is, the above embodiments may be obviously applicable to both a positive design for the projection against dust or moisture, with the structure incapable of flowing air to an outside smoothly and with a structure incapable of forming a vent to exhaust the air forcibly.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A display apparatus comprising:
a panel unit configured to display images;
a circuit unit provided in the panel unit;
a chamber surrounding the circuit unit, the chamber forming a predetermined space;
at least one ventilation fan ventilating air inside the chamber along at least one circulation path passing beyond the circuit unit, and the circulation path passes beyond a high density area where parts are intensively mounted on the circuit unit with a high density and a relatively low density area where parts are mounted on the circuit unit with a relatively low density; and a partition member partitioning off the high density area and the low density area.

2. The display apparatus of claim 1, wherein the circulation path passes beyond different parts mounted on the circuit unit.

3. The display apparatus of claim 1, wherein the partition member partitions the space of the chamber into a right and left space, an upper and lower end of the partition member being spaced apart from the chamber only to form a gap, and the circulation path passes through the gap.

4. The display apparatus of claim 3, wherein the circulation path is a closed path which reciprocates the right and the left space partitioned by the partition member.

5. The display apparatus of claim 1, wherein the at least one ventilation fan is a plurality of ventilation fans, and wherein the at least one of the plurality of ventilation fans is provided near an upper end of the high density area to ventilate the air passing the high density area to the low density area along the circulation path.

6. The display apparatus of claim 5, further comprising at least one ventilation fan provided at a predetermined position except in the high density area.

7. The display apparatus of claim 1, wherein the chamber comprises a radiation plate radiating heat inside the chamber and a frame supporting the radiation plate, and wherein the partition member is in contact with an inner surface of the radiation plate and an upper surface of the circuit unit.

8. The display apparatus of claim 7, wherein the at least one circulation path is a plurality of circulation paths, and wherein each of the circulation paths passes through a ventilation opening formed at the partition member.

9. The display apparatus of claim 8, wherein a ventilation fan is mounted at the ventilation opening.

10. The display apparatus of claim 7, wherein a guide is formed at a corner of the frame.

11. The display apparatus of claim 7, wherein at least one guide member or guide duct is provided in at least one corner of the chamber to guide the air circulating the circulation path, respectively.

12. The display apparatus of claim 7, wherein the ventilation fan is provided at an end of the guide duct.

13. The display apparatus of claim 7, wherein a plurality of radiation pins are provided on an inner surface of the radiation plate, facing the circuit unit.

14. The display apparatus of claim 13, wherein the plurality of the radiation pins are arranged in parallel with the circulation path.

15. The display apparatus of claim 14, the length of the radiation pin provided beyond the high density area is substantially shorter than the length of the radiation pin provided beyond the low density area.

16. The display apparatus of claim 7, further comprising:

a heat transfer member connecting the radiation plate beyond the high density area with a circuit substrate of the high density area.

17. The display apparatus of claim 1, wherein the partition member is a track-shaped ring formed of a sheet.

18. A display apparatus comprising:

a panel unit configured to display images;

a circuit unit connected with an external power to process the images displayed at the panel unit;

a circuit housing surrounding the circuit unit to form a predetermined space, the circuit housing formed of metal to radiate heat generated from the circuit unit to an outside;

at least one ventilation fan circulating air inside the circuit housing to reduce variations of surface temperatures of the circuit housing heated by the heat generated at the circuit unit, and a partition member partitioning an inner space of the circuit housing into predetermined two spaces.

19. The display apparatus of claim 18, further comprising at least one temperature sensor measuring a temperature inside the circuit housing, wherein a rotation speed of the at least one ventilation fan is adjustable.

20. The display apparatus of claim 18, wherein the ventilation fan circulates the air inside the circuit housing to the partitioned spaces.

21. A display apparatus comprising:

a panel unit displaying images;

a circuit unit comprising a circuit substrate where a plurality of circuit parts are mounted;

a circuit housing surrounding the circuit unit, the circuit housing being sealed;

an air ventilation fan transferring the heat generated from the circuit unit to other portions of the circuit housing; and a partition member arranged vertically in an inner space of the circuit housing for providing a circulation path between left and right spaces separated by the partition member.

* * * * *